(12) United States Patent
Chang et al.

(10) Patent No.: US 10,622,353 B2
(45) Date of Patent: Apr. 14, 2020

(54) SEMICONDUCTOR DEVICE

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/022,713

(22) Filed: Jun. 29, 2018

(65) Prior Publication Data

US 2018/0315754 A1    Nov. 1, 2018

Related U.S. Application Data

(62) Division of application No. 14/941,673, filed on Nov. 16, 2015, now Pat. No. 10,020,304.

(51) Int. Cl.
*H01L 27/088* (2006.01)
*H01L 29/78* (2006.01)
(Continued)

(52) U.S. Cl.
CPC ...... *H01L 27/0886* (2013.01); *H01L 21/0223* (2013.01); *H01L 21/02255* (2013.01);
(Continued)

(58) Field of Classification Search
CPC .......... H01L 29/7855; H01L 29/42376; H01L 29/7851; H01L 29/785; H01L 29/6656;
(Continued)

(56) References Cited

U.S. PATENT DOCUMENTS 6,054,355 A  *  4/2000  Inumiya ............ H01L 21/28114
                                                              257/E21.205
7,157,378 B2 *  1/2007  Brask ................ H01L 21/28185
                                                              257/E21.444
(Continued)

OTHER PUBLICATIONS

"Office Action of Taiwan Counterpart Application," dated May 21, 2019, p. 1-p. 3.

*Primary Examiner* — Sophia T Nguyen
(74) *Attorney, Agent, or Firm* — JCIPRNET

(57) ABSTRACT

A substrate is patterned to form trenches and a semiconductor fin between the trenches. Insulators are formed in the trenches and a first dielectric layer is formed to cover the semiconductor fin and the insulators. A dummy gate strip is formed on the first dielectric layer. Spacers are formed on sidewalls of the dummy gate strip. The dummy gate strip and the first dielectric layer underneath are removed until sidewalls of the spacers, a portion of the semiconductor fin and portions of the insulators are exposed. A second dielectric layer is selectively formed to cover the exposed portion of the semiconductor fin, wherein a thickness of the first dielectric layer is smaller than a thickness of the second dielectric layer. A gate is formed between the spacers to cover the second dielectric layer, the sidewalls of the spacers and the exposed portions of the insulators.

20 Claims, 13 Drawing Sheets

(51) Int. Cl.
| | |
|---|---|
| *H01L 21/8234* | (2006.01) |
| *H01L 29/66* | (2006.01) |
| *H01L 21/8238* | (2006.01) |
| *H01L 27/092* | (2006.01) |
| *H01L 29/16* | (2006.01) |
| *H01L 21/02* | (2006.01) |
| *H01L 21/762* | (2006.01) |
| *H01L 29/06* | (2006.01) |
| *H01L 29/423* | (2006.01) |
| *H01L 27/12* | (2006.01) |
| *H01L 21/84* | (2006.01) |

(52) U.S. Cl.
CPC ........... *H01L 21/76224* (2013.01); *H01L 21/823431* (2013.01); *H01L 21/823462* (2013.01); *H01L 21/823481* (2013.01); *H01L 21/823821* (2013.01); *H01L 21/823828* (2013.01); *H01L 21/823857* (2013.01); *H01L 27/0924* (2013.01); *H01L 29/0649* (2013.01); *H01L 29/16* (2013.01); *H01L 29/42376* (2013.01); *H01L 29/6656* (2013.01); *H01L 29/66545* (2013.01); *H01L 29/66795* (2013.01); *H01L 29/785* (2013.01); *H01L 29/7851* (2013.01); *H01L 29/7855* (2013.01); *H01L 21/845* (2013.01); *H01L 27/1211* (2013.01); *H01L 2029/7858* (2013.01)

(58) Field of Classification Search
CPC ........ H01L 29/66545; H01L 21/82321; H01L 21/823857; H01L 21/823821; H01L 21/823828; H01L 21/823462; H01L 21/823457; H01L 21/02255; H01L 21/0223; H01L 27/1211; H01L 27/0924; H01L 27/0886; H01L 27/823431
See application file for complete search history.

(56) References Cited

U.S. PATENT DOCUMENTS

| | | | | |
|---|---|---|---|---|
| 7,517,764 | B2* | 4/2009 | Booth, Jr. ......... | H01L 29/66795 257/E21.442 |
| 7,855,105 | B1* | 12/2010 | Jagannathan ... | H01L 21/823431 257/E21.629 |
| 8,791,509 | B2* | 7/2014 | Beyer ............... | H01L 29/41791 257/288 |
| 8,826,213 | B1* | 9/2014 | Ho ..................... | G06F 17/5036 716/110 |
| 9,034,700 | B1* | 5/2015 | Jeong ............... | H01L 29/66818 257/E21.623 |
| 9,112,032 | B1* | 8/2015 | Liu ................... | H01L 29/66795 |
| 9,190,272 | B1* | 11/2015 | Park ................... | H01L 21/28114 |
| 9,190,488 | B1* | 11/2015 | Park ................... | H01L 29/517 |
| 9,331,074 | B1* | 5/2016 | Chang ............... | H01L 27/0886 |
| 9,362,181 | B1* | 6/2016 | Xie .................. | H01L 21/823878 |
| 9,412,616 | B1* | 8/2016 | Xie .................. | H01L 21/76224 |
| 9,425,318 | B1* | 8/2016 | Hoentschel ......... | H01L 29/7851 |
| 9,536,985 | B2* | 1/2017 | Chudzik ............ | H01L 29/66795 |
| 9,553,171 | B2* | 1/2017 | Chang ............... | H01L 29/66795 |
| 9,564,489 | B2* | 2/2017 | Yeo ................... | H01L 29/1054 |
| 9,570,580 | B1* | 2/2017 | Chiang ............... | H01L 29/66795 |
| 9,607,838 | B1* | 3/2017 | Lin ................... | H01L 29/7842 |
| 9,627,375 | B2* | 4/2017 | Chang ............. | H01L 21/823431 |
| 9,773,792 | B1* | 9/2017 | Liaw ............... | H01L 27/11206 |
| 10,170,317 | B1* | 1/2019 | Huang ............. | H01L 29/66568 |
| 10,242,982 | B2* | 3/2019 | Xie .................. | H01L 27/0886 |
| 2004/0132253 | A1* | 7/2004 | Hori ............... | H01L 21/823462 438/275 |
| 2007/0034971 | A1* | 2/2007 | Anderson ....... | H01L 21/823807 257/401 |
| 2007/0111448 | A1* | 5/2007 | Li ................... | H01L 21/823821 438/264 |
| 2008/0116530 | A1* | 5/2008 | Hyun .............. | H01L 21/823437 257/410 |
| 2010/0317181 | A1* | 12/2010 | Chung ............ | H01L 21/823821 438/585 |
| 2011/0101421 | A1* | 5/2011 | Xu .................. | H01L 21/02381 257/255 |
| 2011/0241086 | A1* | 10/2011 | Kurz ............... | H01L 23/5256 257/288 |
| 2012/0313178 | A1* | 12/2012 | Liao ................ | H01L 29/66545 257/368 |
| 2013/0228862 | A1* | 9/2013 | Lee ................. | H01L 21/823807 257/347 |
| 2013/0244414 | A1* | 9/2013 | Song ................ | H01L 29/401 438/591 |
| 2013/0292744 | A1* | 11/2013 | Kim ................ | H01L 21/823857 257/288 |
| 2013/0299914 | A1* | 11/2013 | Kim ................ | H01L 27/092 257/369 |
| 2014/0008720 | A1* | 1/2014 | Xie ................. | H01L 27/092 257/331 |
| 2014/0065782 | A1* | 3/2014 | Lu .................. | H01L 29/785 438/294 |
| 2014/0070327 | A1* | 3/2014 | Niimi ............. | H01L 27/092 257/369 |
| 2014/0070328 | A1 | 3/2014 | Goto et al. | |
| 2014/0103438 | A1* | 4/2014 | Wang ............. | H01L 21/823431 257/347 |
| 2014/0179076 | A1* | 6/2014 | Shinohara ........ | H01L 29/42344 438/275 |
| 2014/0282326 | A1* | 9/2014 | Chen .............. | G06F 17/5081 716/111 |
| 2014/0319620 | A1* | 10/2014 | Hoentschel ........ | H01L 28/20 257/379 |
| 2014/0353719 | A1* | 12/2014 | Kim ............... | H01L 27/0886 257/192 |
| 2015/0021681 | A1* | 1/2015 | Hou ............... | H01L 21/823807 257/330 |
| 2015/0162334 | A1* | 6/2015 | Ho .................. | H01L 27/0924 257/401 |
| 2015/0171085 | A1 | 6/2015 | Fumtake et al. | |
| 2015/0200252 | A1 | 7/2015 | Ching et al. | |
| 2015/0206974 | A1* | 7/2015 | Lim ................ | H01L 29/7851 257/288 |
| 2015/0270177 | A1* | 9/2015 | Tseng ............. | H01L 21/823857 438/216 |
| 2015/0279972 | A1* | 10/2015 | Xie ................. | H01L 29/66795 438/283 |
| 2015/0303272 | A1* | 10/2015 | Bryant ........... | H01L 29/66795 257/347 |
| 2015/0303283 | A1* | 10/2015 | Chien ............. | H01L 29/66803 438/478 |
| 2015/0303305 | A1* | 10/2015 | Ching ............. | H01L 29/7851 257/192 |
| 2015/0318399 | A1* | 11/2015 | Jeong ............. | H01L 29/7853 257/401 |
| 2015/0371867 | A1* | 12/2015 | Leobandung ..... | H01L 21/31116 257/401 |
| 2016/0104704 | A1* | 4/2016 | Fang .............. | H01L 29/4966 257/392 |
| 2016/0104711 | A1* | 4/2016 | Hsu ................ | G11C 16/14 |
| 2016/0133719 | A1* | 5/2016 | Xie ................. | H01L 29/66553 438/595 |
| 2016/0204245 | A1* | 7/2016 | Jangjian ......... | H01L 29/66545 257/401 |
| 2016/0268399 | A1* | 9/2016 | Akarvardar ....... | H01L 29/66795 |
| 2016/0329414 | A1* | 11/2016 | Lee ................ | H01L 29/66795 |
| 2016/0343862 | A1* | 11/2016 | Chang ............ | H01L 29/7856 |
| 2016/0351570 | A1* | 12/2016 | Park ................ | H01L 27/0924 |
| 2016/0365290 | A1* | 12/2016 | Cho ................ | H01L 27/0924 |
| 2017/0104087 | A1* | 4/2017 | Chang ............ | H01L 29/66795 |
| 2017/0141106 | A1* | 5/2017 | Chang ............ | H01L 21/823462 |
| 2017/0170300 | A1* | 6/2017 | Chang ............ | H01L 29/66795 |
| 2017/0179123 | A1* | 6/2017 | Chang ............ | H01L 27/0886 |
| 2017/0330801 | A1* | 11/2017 | Ragnarsson ........ | H01L 21/0214 |

(56) References Cited

U.S. PATENT DOCUMENTS

2017/0358681 A1* 12/2017 Chang ................. H01L 29/7856
2018/0240895 A1*  8/2018 Chang ............... H01L 29/66795
2019/0164963 A1*  5/2019 Lee .................... H01L 27/0886

* cited by examiner

SEMICONDUCTOR DEVICE

CROSS-REFERENCE TO RELATED APPLICATION

This application is a divisional application of U.S. application Ser. No. 14/941,673, filed on Nov. 16, 2015, now allowed. The entirety of each of the above-mentioned patent applications is hereby incorporated by reference herein and made a part of this specification.

BACKGROUND

As the semiconductor devices keeps scaling down in size, three-dimensional multi-gate structures, such as the fin-type field effect transistors (FinFETs), have been developed to replace planar Complementary Metal Oxide Semiconductor (CMOS) devices. A structural feature of the FinFET is the silicon-based fin that extends upright from the surface of the substrate, and the gate wrapping around the conducting channel that is formed by the fin further provides a better electrical control over the channel.

For the gate replacement process of the FinFET with short channel (i.e. channel length smaller than 50 nm), a portion of oxide layer covering the silicon-based fin is needed to be over-etched such that process window of the sequential depositions for high-k dielectric layer and gate is better. However, high etching amount of oxide layer induces leakage path and extrusion path for metal gate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
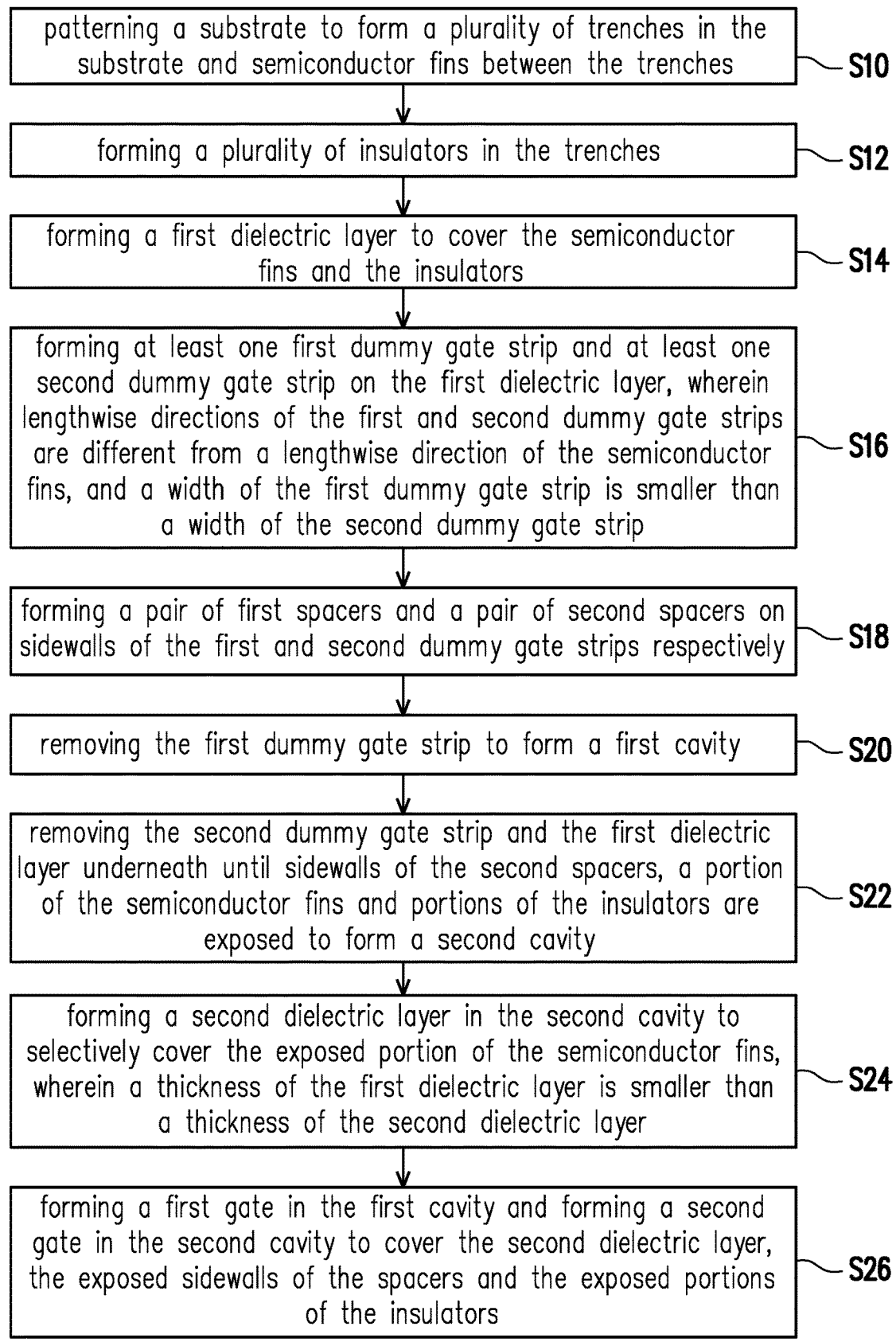
FIG. 1 is a flow chart illustrating a method for fabricating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary fabricating process of a semiconductor device which comprises at least one long channel FinFET and at least one short channel FinFET. The semiconductor device may be formed on bulk silicon substrates in certain embodiments of the present disclosure. Still, the semiconductor device may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not limited in this context.

Referring to FIG. 1, illustrated is a flow chart illustrating a method for fabricating a semiconductor device in accordance with some embodiments of the present disclosure. The fabricating method at least includes steps S10, step S12, step S14, step S16, step S18, step S20, step 22, step 24 and step S26. First, in step S10, a substrate is provided, and the substrate is then patterned to form a plurality of trenches and a plurality semiconductor fins between the trenches. In step S12, a plurality of insulators are formed in the trenches. The insulators are shallow trench isolation (STI) structures for insulating semiconductor fins, for example. In step S14, a first dielectric layer is formed to cover the semiconductor fins and the insulators. In step S16, at least one first dummy gate strip and at least one second dummy gate strip are formed on the first dielectric layer, wherein lengthwise directions of the first and second dummy gate strips are different from a lengthwise direction of the semiconductor fins, and a width of the first dummy gate strip is smaller than a width of the second dummy gate strip. The first dummy gate strip and the second dummy gate strip are conductive strips, such as poly-silicon strips. In step S18, a pair of first spacers and a pair of second spacers are formed on sidewalls of the first and second dummy gate strips respectively. In step S20, the first dummy gate strip is removed to form a first cavity. In step S22, the second dummy gate strip and the first dielectric layer underneath are removed until sidewalls of the second spacers, a portion of the semiconductor fins and portions of the insulators are exposed so as to form a second cavity. In step S24, a second dielectric layer is conformally formed in the second cavity to cover the sidewalls of the second spacers, the exposed portion of the semiconductor fins and the exposed portions of the insulators, wherein a thickness of the first dielectric layer is smaller than a thickness of the second dielectric layer. The second dielectric layer is formed by atomic layer deposition (ALD), chemical vapor deposition (CVD) or physical vapor deposition (PVD), for example. In step S26, a first gate is formed in the first cavity and a second gate is formed on the second dielectric layer and in the second cavity. As illustrated in FIG. 1, removal of the first dummy gate strip is performed before removal of the second dummy gate strip. However, removal sequence of the first dummy gate strip (step S20) and the second dummy gate strip (step S22) is not limited in the present disclosure.

Figure 2A:
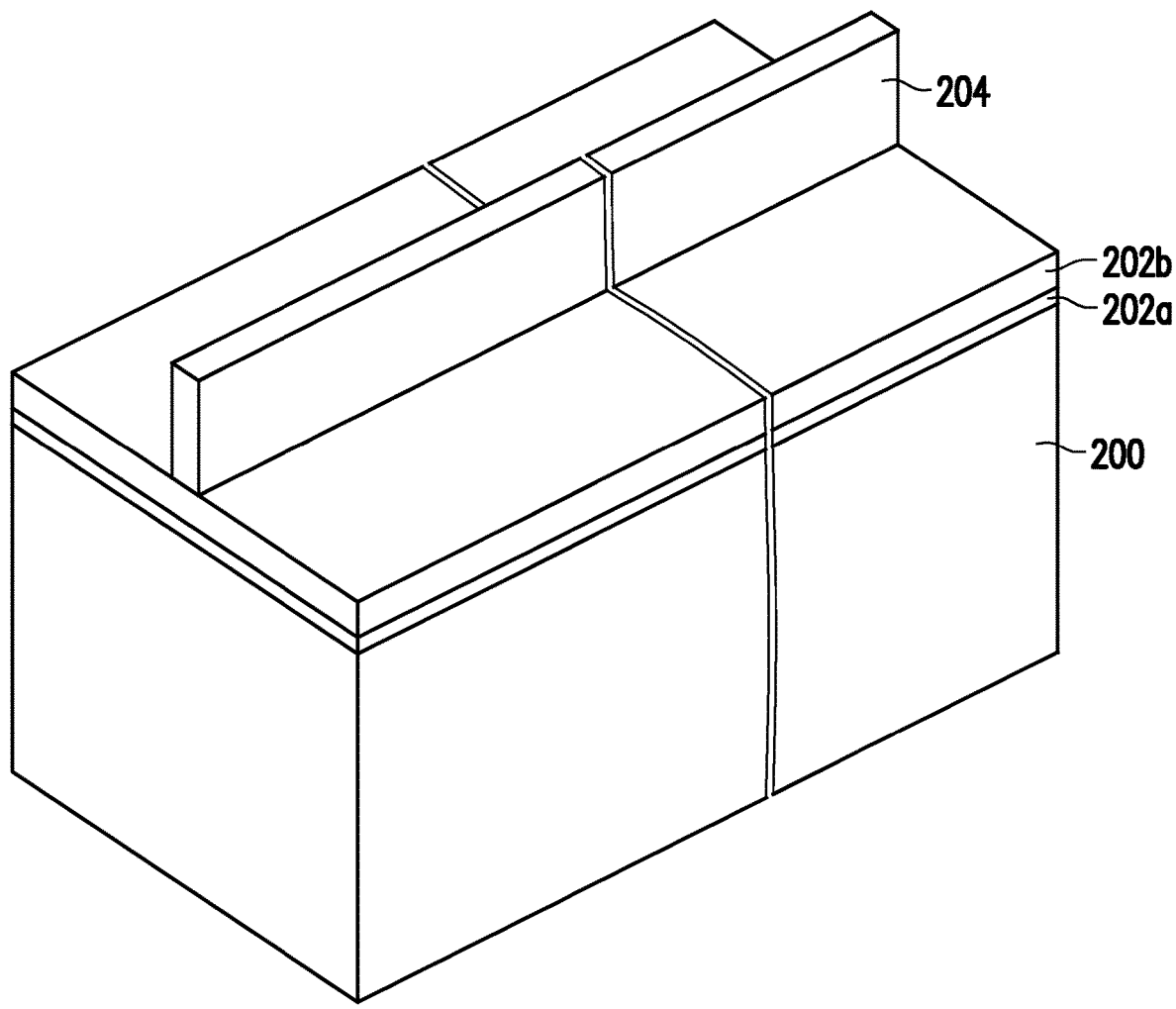
FIGS. 2A-2L are perspective views of a method for fabricating a semiconductor device in accordance with some embodiments.

FIG. 2A is a perspective view of the semiconductor device at one of various stages of the manufacturing method. In Step 10 in FIG. 1 and as shown in FIG. 2A, a substrate 200 is provided. In one embodiment, the substrate 200 comprises a crystalline silicon substrate (e.g., wafer). The substrate 200 may comprise various doped regions depending on design requirements (e.g., p-type substrate or n-type substrate). In some embodiments, the doped regions may be doped with p-type and/or n-type dopants. For example, the doped regions may be doped with p-type dopants, such as boron or $BF_2$; n-type dopants, such as phosphorus or arsenic; and/or combinations thereof. The doped regions may be configured for an n-type FinFET, a p-type FinFET or the combination thereof. In some alternative embodiments, the substrate 200 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In one embodiment, a pad layer 202a and a mask layer 202b are sequentially formed on the substrate 200. The pad layer 202a may be a silicon oxide thin film formed, for example, by thermal oxidation process. The pad layer 202a may act as an adhesion layer between the substrate 200 and mask layer 202b. The pad layer 202a may also act as an etch stop layer for etching the mask layer 202b. In at least one embodiment, the mask layer 202b is a silicon nitride layer formed, for example, by low-pressure chemical vapor deposition (LPCVD) or plasma enhanced chemical vapor deposition (PECVD). The mask layer 202b is used as a hard mask during subsequent photolithography processes. Then, a patterned photoresist layer 204 having a predetermined pattern is formed on the mask layer 202b.

Figure 2B:
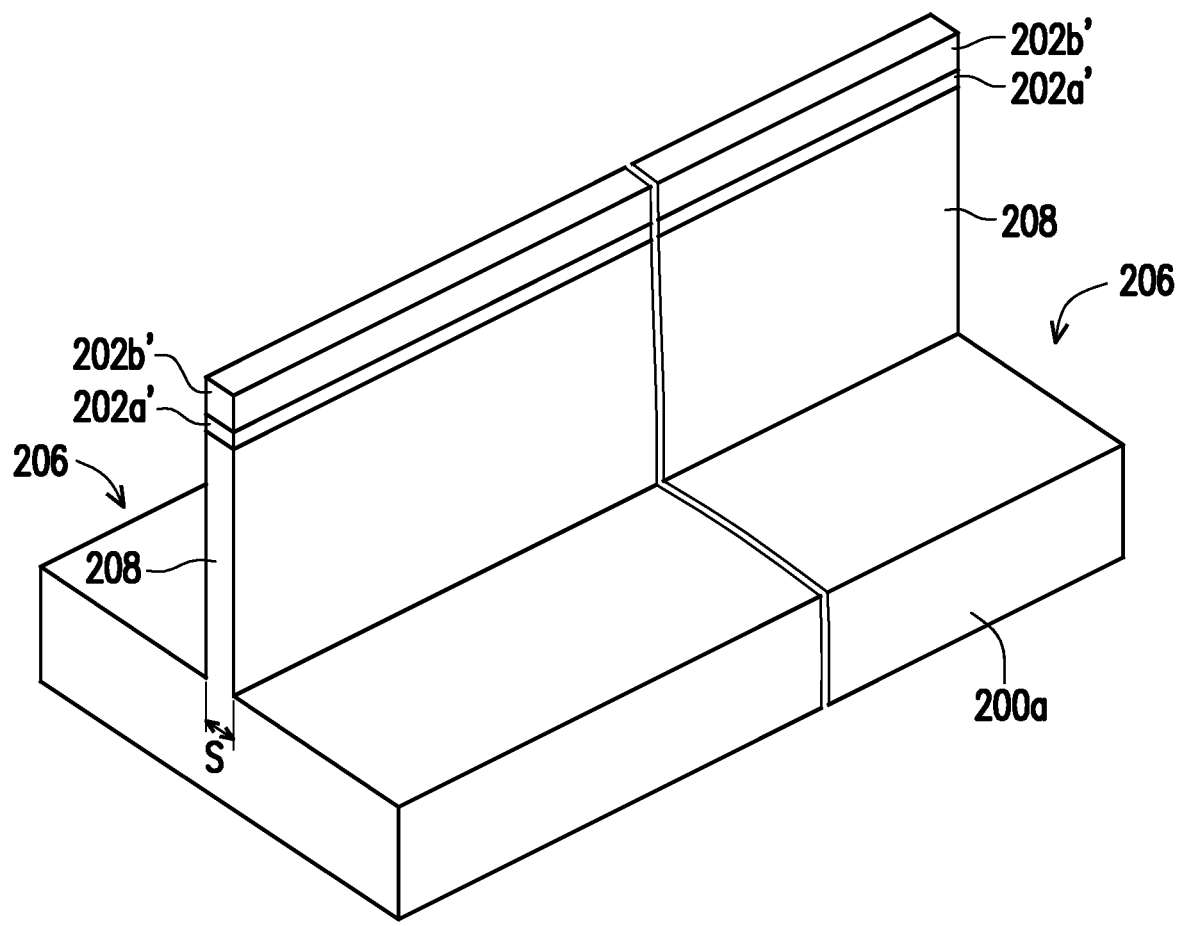

FIG. 2B is a perspective view of the semiconductor device at one of various stages of the manufacturing method. In Step S10 in FIG. 1 and as shown in FIGS. 2A-2B, the mask layer 202b and the pad layer 202a which are not covered by the patterned photoresist layer 204 are sequentially etched to form a patterned mask layer 202b' and a patterned pad layer 202a' so as to expose underlying substrate 200. By using the patterned mask layer 202b', the patterned pad layer 202a' and the patterned photoresist layer 204 as a mask, portions of the substrate 200 are exposed and etched to form trenches 206 and semiconductor fins 208. After the substrate 200 is patterned, the semiconductor fins 208 are covered by the patterned mask layer 202b', the patterned pad layer 202a' and the patterned photoresist layer 204. Two adjacent trenches 206 are spaced apart by a spacing S. For example, the spacing S between trenches 206 may be smaller than about 30 nm. In other words, two adjacent trenches 206 are spaced apart by a corresponding semiconductor fin 208.

The height of the semiconductor fins 208 and the depth of the trench 206 range from about 5 nm to about 500 nm. After the trenches 206 and the semiconductor fins 208 are formed, the patterned photoresist layer 204 is then removed. In one embodiment, a cleaning process may be performed to remove a native oxide of the semiconductor substrate 200a and the semiconductor fins 208. The cleaning process may be performed using diluted hydrofluoric (DHF) acid or other suitable cleaning solutions.

Figure 2C:
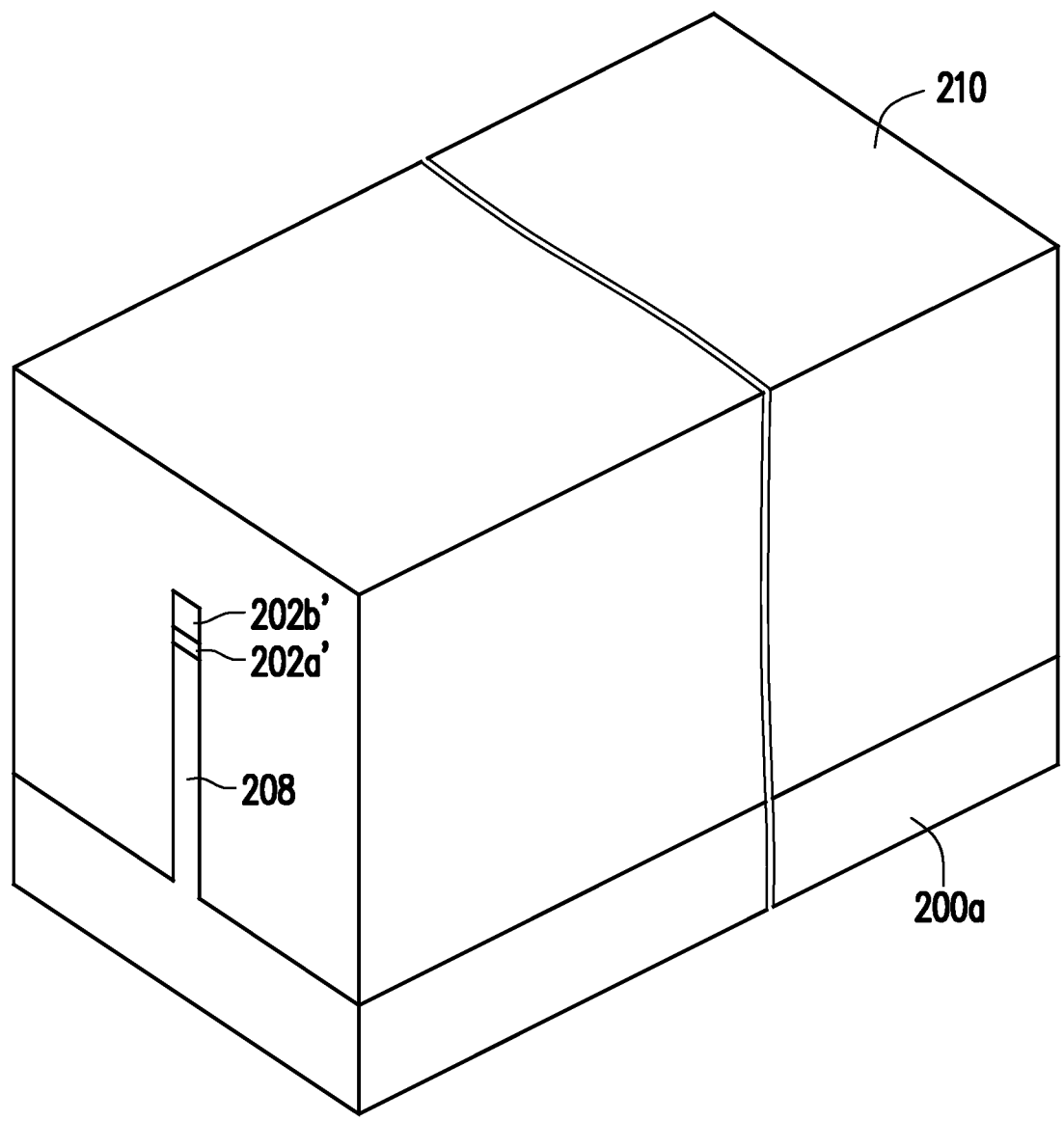

FIG. 2C is a perspective view of the semiconductor device at one of various stages of the manufacturing method. In Step S12 in FIG. 1 and as shown in FIGS. 2B-2C, an insulating material 210 are formed over the substrate 200a to cover the semiconductor fins 208 and fill up the trenches 206. In addition to the semiconductor fins 208, the insulating material 210 further covers the patterned pad layer 202a' and the patterned mask layer 202b'. The insulating material 210 may include silicon oxide, silicon nitride, silicon oxynitride, a spin-on dielectric material, or a low-K dielectric material. The insulating material 210 may be formed by high-density-plasma chemical vapor deposition (HDP-CVD), sub-atmospheric CVD (SACVD) or by spin-on.

Figure 2D:
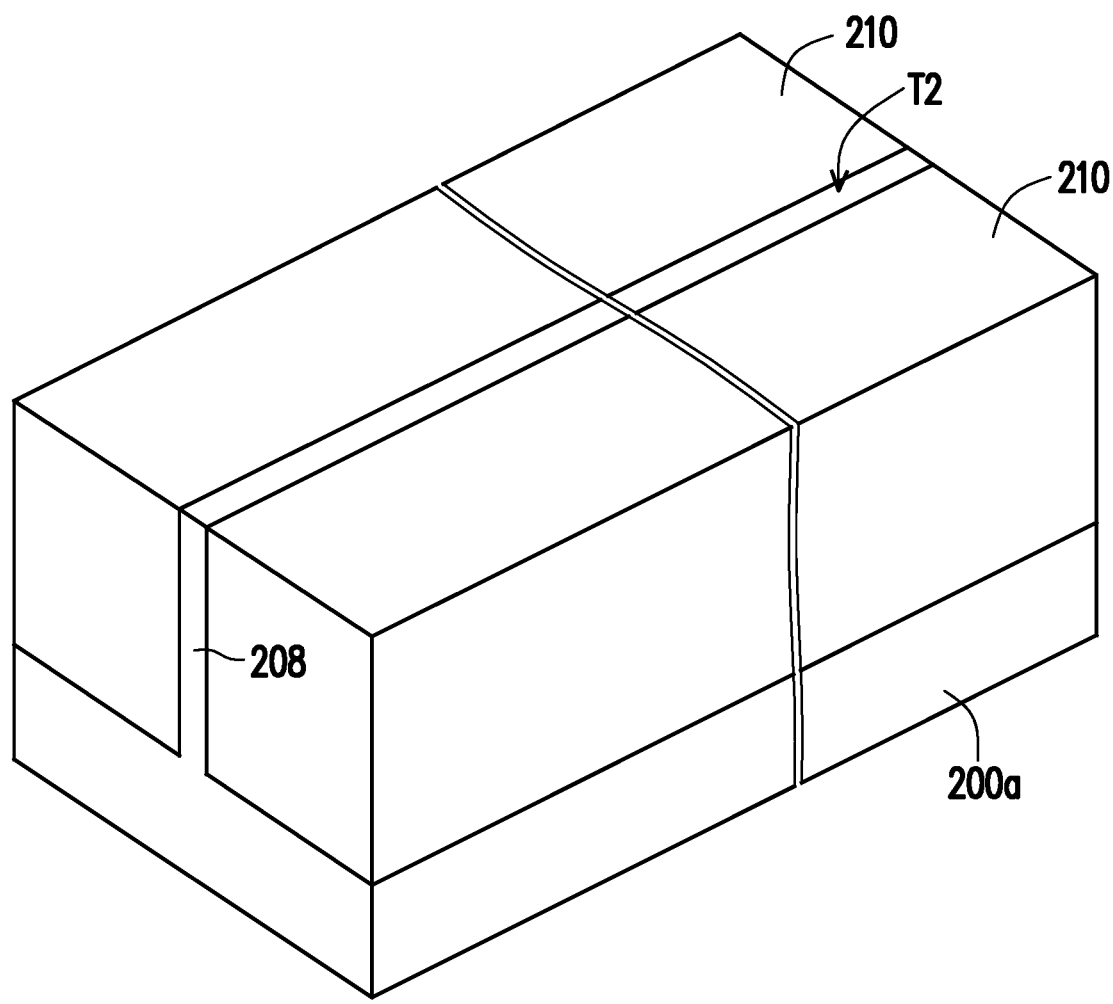

FIG. 2D is a perspective view of the semiconductor device at one of various stages of the manufacturing method. In Step S12 in FIG. 1 and as shown in FIGS. 2C-2D, a chemical mechanical polish process is, for example, performed to remove a portion of the insulating material 210, the patterned mask layer 202b' and the patterned pad layer 202a' until the semiconductor fins 208 are exposed. As shown in FIG. 2D, after the insulating material 210 is polished, top surfaces of the polished insulating material 210 is substantially coplanar with top surface T2 of the semiconductor fins.

Figure 2E:
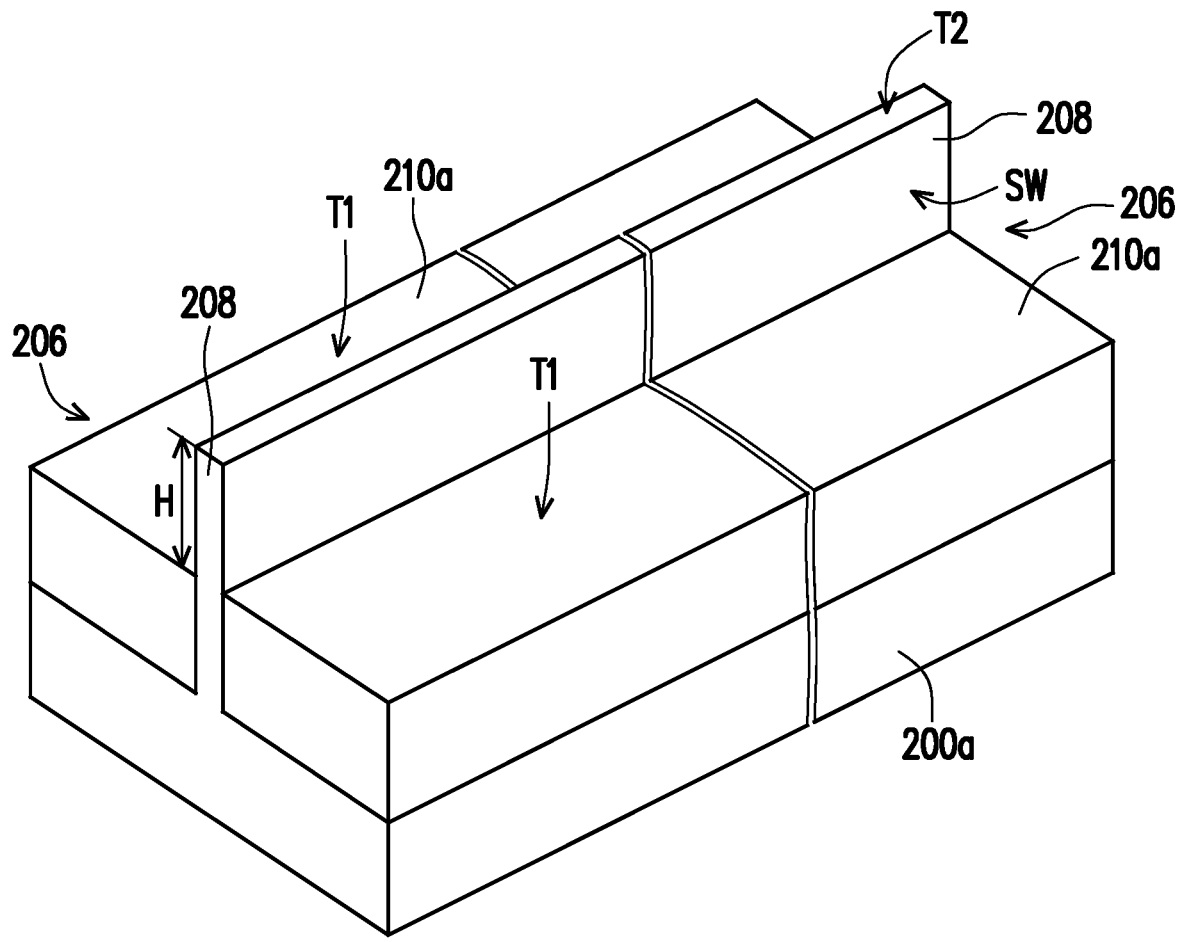

FIG. 2E is a perspective view of the semiconductor device at one of various stages of the manufacturing method. In Step S12 in FIG. 1 and as shown in FIGS. 2D-2E, the polished insulating material 210 filled in the trenches 206 is partially removed by an etching process such that insulators 210a are formed on the substrate 200a and each insulator 210a is located between two adjacent semiconductor fins 208. In one embodiment, the etching process may be a wet etching process with hydrofluoric acid (HF) or a dry etching process. The top surfaces T1 of the insulators 210a are lower than the top surfaces T2 of the semiconductor fins 208. In other words, the semiconductor fins 208 protrude from the top surfaces T1 of the insulators 210a and sidewalls SW of the semiconductor fins 208 are thus exposed. The height difference between the top surfaces T2 of the fins 208 and the top surfaces T1 of the insulators 210a is H, and the height difference H ranges from about 15 nm to about 50 nm.

Figure 2F:
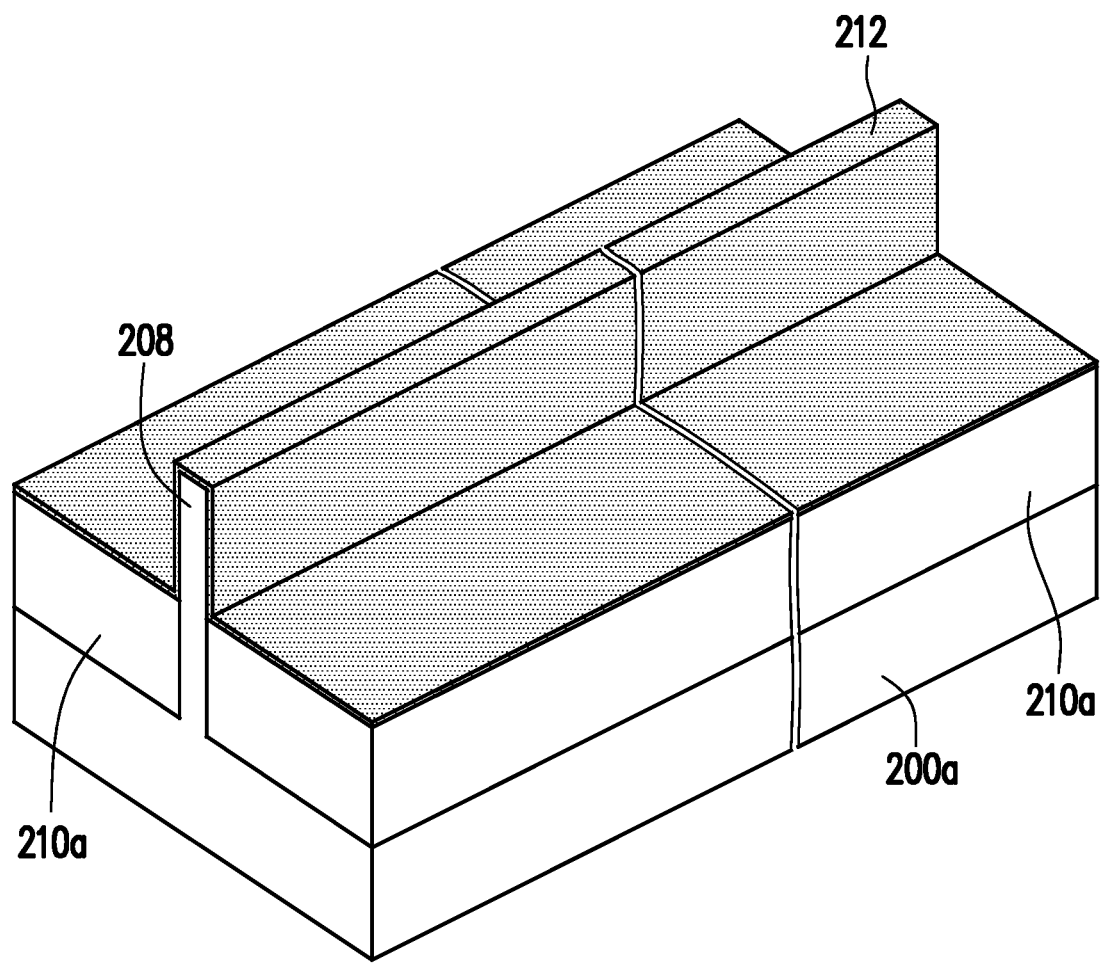

FIG. 2F is a perspective view of the semiconductor device at one of various stages of the manufacturing method. In Step S14 in FIG. 1 and as shown in FIGS. 2E-2F, after the insulators 210a are formed, a first dielectric layer 212 is formed to conformally cover the top surface T1 of the insulators 210a, the top surfaces T2 of the semiconductor fins 208 and the sidewall SW of the semiconductor fins 208. In one embodiment, the first dielectric layer 212 may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In one embodiment, the first dielectric layer 212 is a high-k dielectric layer with a thickness in the range of about 0.2 nm to 5 nm. The first dielectric layer 212 may be formed by a suitable process such as atomic layer deposition (ALD), chemical vapor deposition (CVD), physical vapor deposition (PVD), thermal oxidation or UV-ozone oxidation. The first dielectric layer 212 is thin enough and has good quality to serve as a gate dielectric layer in short channel FinFETs.

Figure 2G:
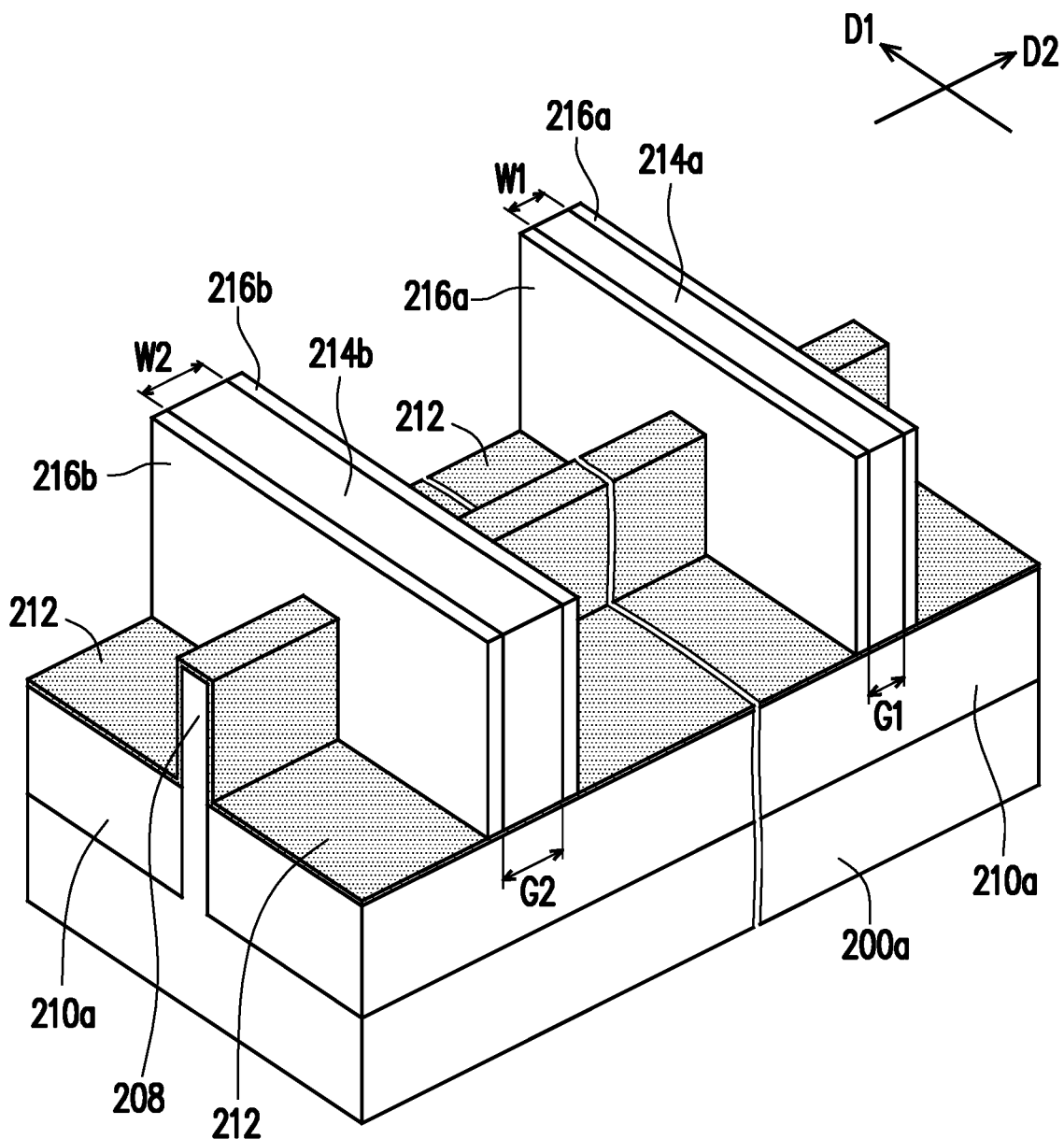

FIG. 2G is a perspective view of the semiconductor device at one of various stages of the manufacturing method. In Step S16 in FIG. 1 and as shown in FIGS. 2F-2G, at least one first dummy gate strip 214a and at least one second dummy gate strip 214b are formed on the first dielectric layer 212, wherein lengthwise directions D1 of the first and second dummy gate strips 214a, 214b are different from a lengthwise direction D2 of the semiconductor fins 208. Along the lengthwise direction D1, a first width W1 of the first dummy gate strip 214a is smaller than a second width W2 of the second dummy gate strip 214b. The lengthwise directions D1 of the first and second dummy gate strips 214a, 214b are perpendicular to the lengthwise direction D2 of the semiconductor fins 208, for example. The number of the first and second dummy gate strips 214a, 214b shown in FIG. 2G is merely for illustration, in some alternative embodiments, two or more first and second dummy gate strips 214a, 214b may be formed in accordance with actual design requirements. The first and second dummy gate strips 214a, 214b include a silicon-containing material, such as poly-silicon, amorphous silicon or a combination thereof. In one embodiment, the first width W1 of the first dummy gate strip 210a ranges from 5 nm to 50 nm and the second width W2 of the second dummy gate strip 210b is greater than 50 nm.

Figure 2H:
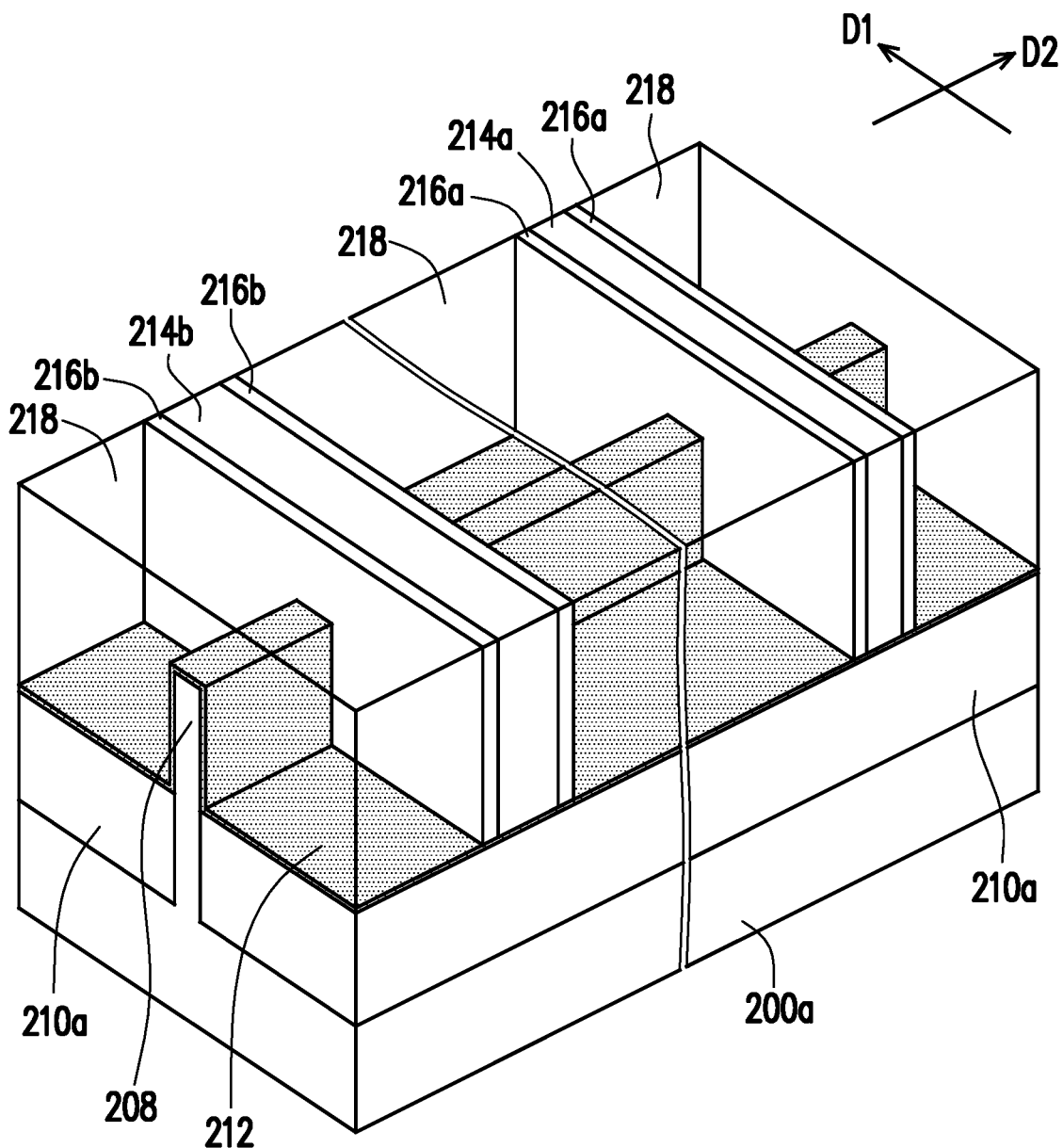

In Step S18 in FIG. 1 and as shown in FIG. 2G, after the first and second dummy gate strips 214a, 214b are formed, a pair of first spacers 216a and a pair of second spacers 216b are formed on sidewalls of the first and second dummy gate strips 214a, 214b respectively. As shown in FIG. 2H, the first spacers 216a are formed on the first dielectric layer 212 and extend along the sidewalls of the first dummy gate strip 214a while the second spacers 216b are formed on the first dielectric layer 212 and extend along the sidewalls of the second dummy gate strip 214b. The first and second spacers 216a, 216b are formed of dielectric materials, such as silicon nitride or SiCON. The first and second spacers 216a, 216b may include a single layer or multilayer structure. Since the pair of first spacers 216a are spaced apart by the first dummy gate strip 214a, a first gap G1 (distance) between the pair of first spacer 216a substantially equals to the first width W1 of the first dummy gate strip 214a. Similarly, a second gap G2 (distance) between the pair of second spacer 216b substantially equals to the second width W2 of the second dummy gate strip 214b.

FIG. 2H is a perspective view of the semiconductor device at one of various stages of the manufacturing method. As shown in FIG. 2H, interlayer dielectric layers 218 are formed to cover the first dielectric layer 212. Top surfaces of the interlayer dielectric layers 218 are substantially co-planar with top surfaces of the first dummy gate strip 214a and the second dummy gate strip 214b. In some embodiments, before the interlayer dielectric layers 218 are formed, some processes (e.g. patterning process of first dielectric layer 212, fin recessing process, strained source/drain epitaxial process on the semiconductor fins, silicidation process and so on) may be performed in advance. Details of the aforesaid processes are omitted.

Figure 2I:
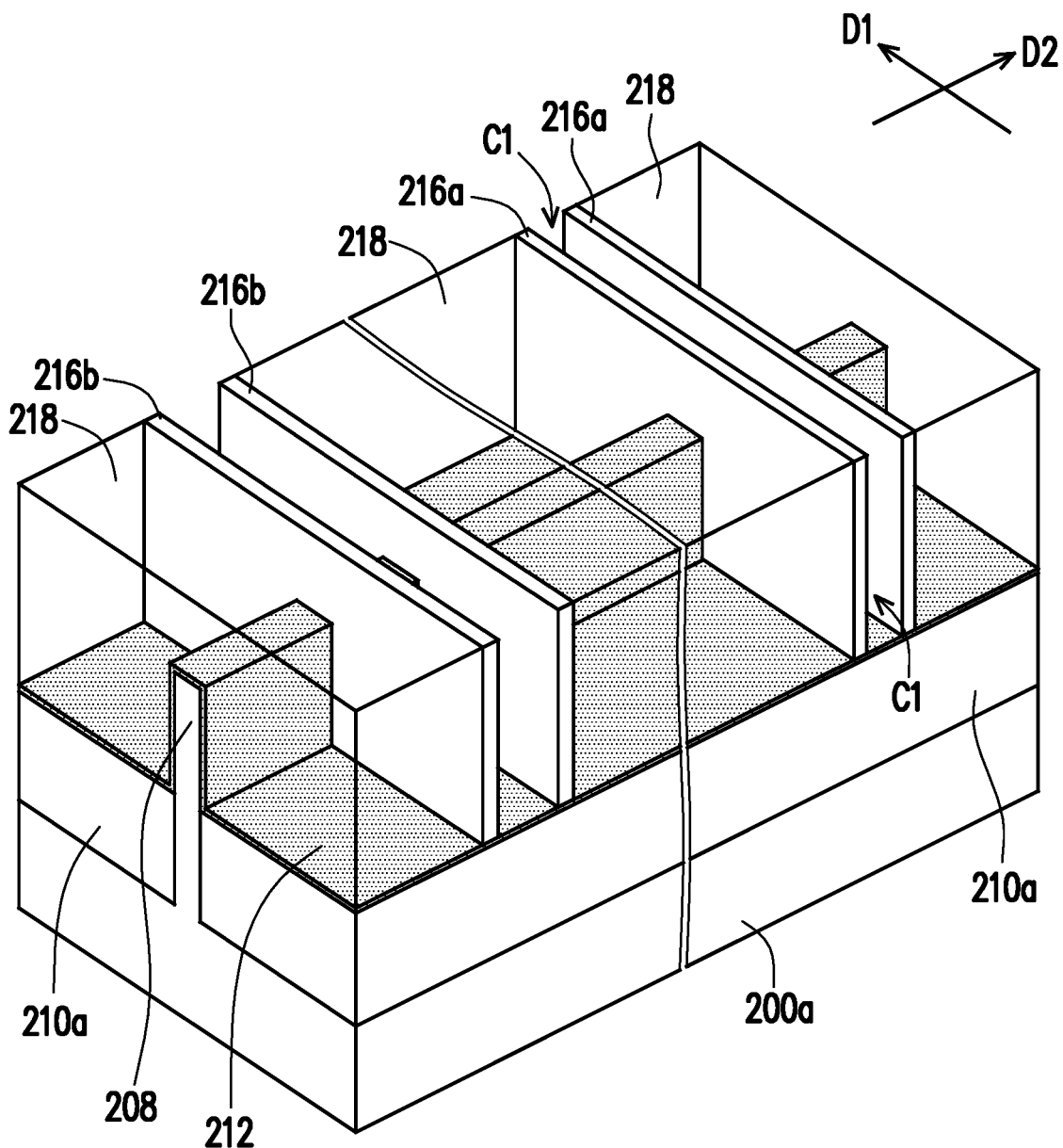
Figure 2J:
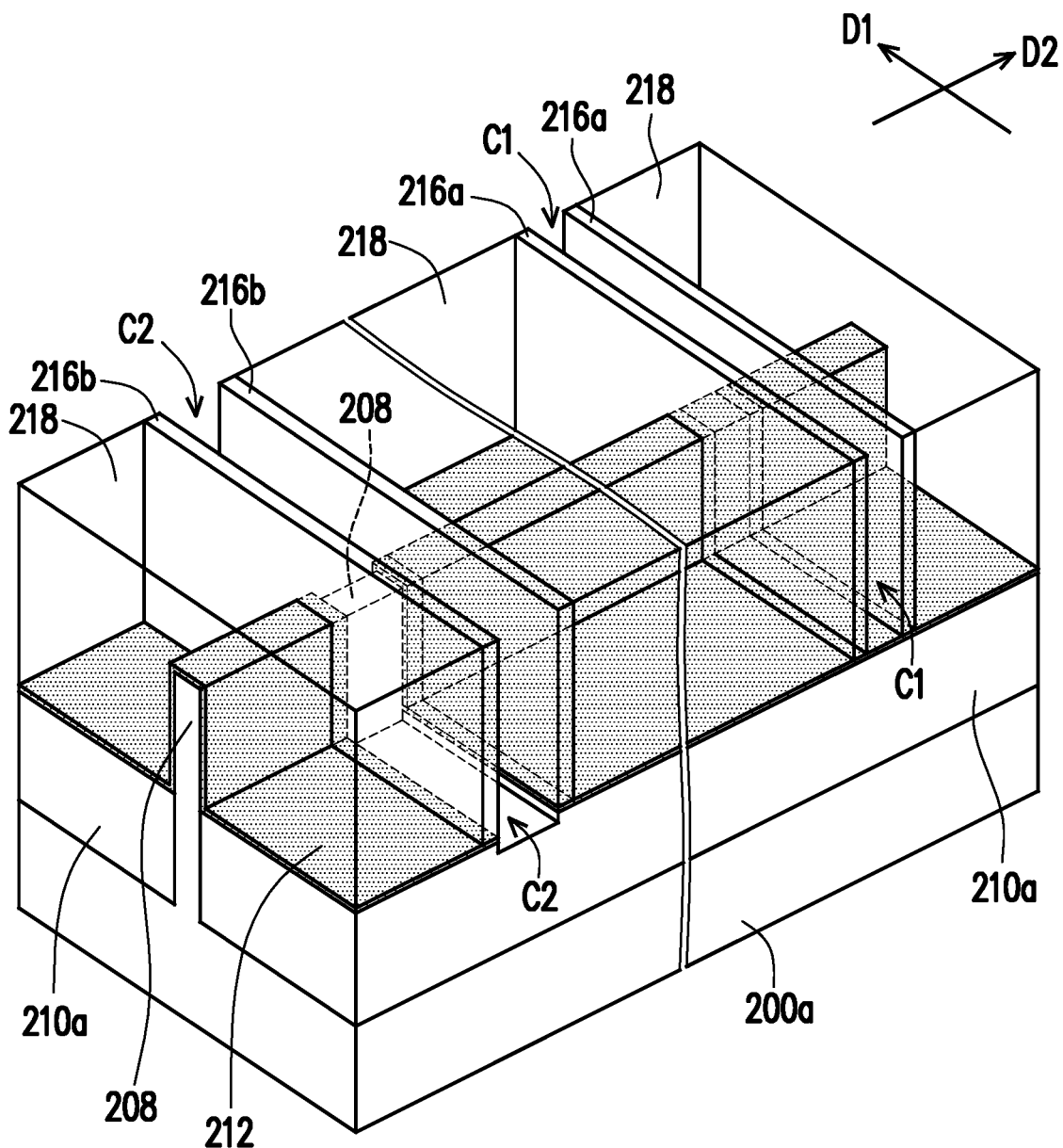

FIG. 2I-2J are perspective views of the semiconductor device at various stages of the manufacturing method. In Steps S20, S22 in FIG. 1 and as shown in FIGS. 2H-2J, the first dummy gate strip 214a and the second dummy gate strip 214b are removed. In one embodiment, the first dummy gate strip 214a and the second dummy gate strip 214b are removed, for example, by an etching process. Through properly selecting of etchant, the first dummy gate strip 214a and the second dummy gate strip 214b are removed without damaging the interlayer dielectric layers 218, the first dielectric layer 212, the first spacers 216a and the second spacer 216b significantly. After the first dummy gate strip 214a is removed, a first cavity C1 between the pair of first spacers 216a is formed and a portion of first dielectric layer 212 is thus exposed. A portion of the semiconductor fin 208 (shown in the right portion of FIG. 2J) corresponding to the first cavity C1 is still covered by the first dielectric layer 212.

As shown in FIG. 2J, a portion of the first dielectric layer 212 and portions of the insulators 210a located under the second dummy gate strip 214b are further removed until sidewalls of the second spacers 216b, a portion of the semiconductor fins 208 and portions of the insulators 210a are exposed so as to form a second cavity C2. During the formation of the second cavity C2, the first dielectric layer 212 exposed by the first cavity C1 is, for example, well protected from being removed. In one embodiment, the first dielectric layer 212 exposed by the first cavity C1 may be protected and covered by a photoresist layer from being removed.

During the formation of the second cavity C2, the first dielectric layer 212 is etched-off and is over-etched slightly. In some alternative embodiments, during the formation of the second cavity C2, the insulators 210a may function as etching stop layers so as to control the profile of the second cavity C2. After the second cavity C2 is formed, a portion of the semiconductor fin 208 (shown in the left portion of FIG. 2J) corresponding to the second cavity C2 is exposed. It is noted that, along the lengthwise direction D2 of the semiconductor fins 208, the portion of the semiconductor fin 208 (shown in the left portion of FIG. 2J) corresponding to the second cavity C2 has greater dimension while the portion of the semiconductor fin 208 (shown in the right portion of FIG. 2J) corresponding to the first cavity C1 has smaller dimension.

Figure 2K:
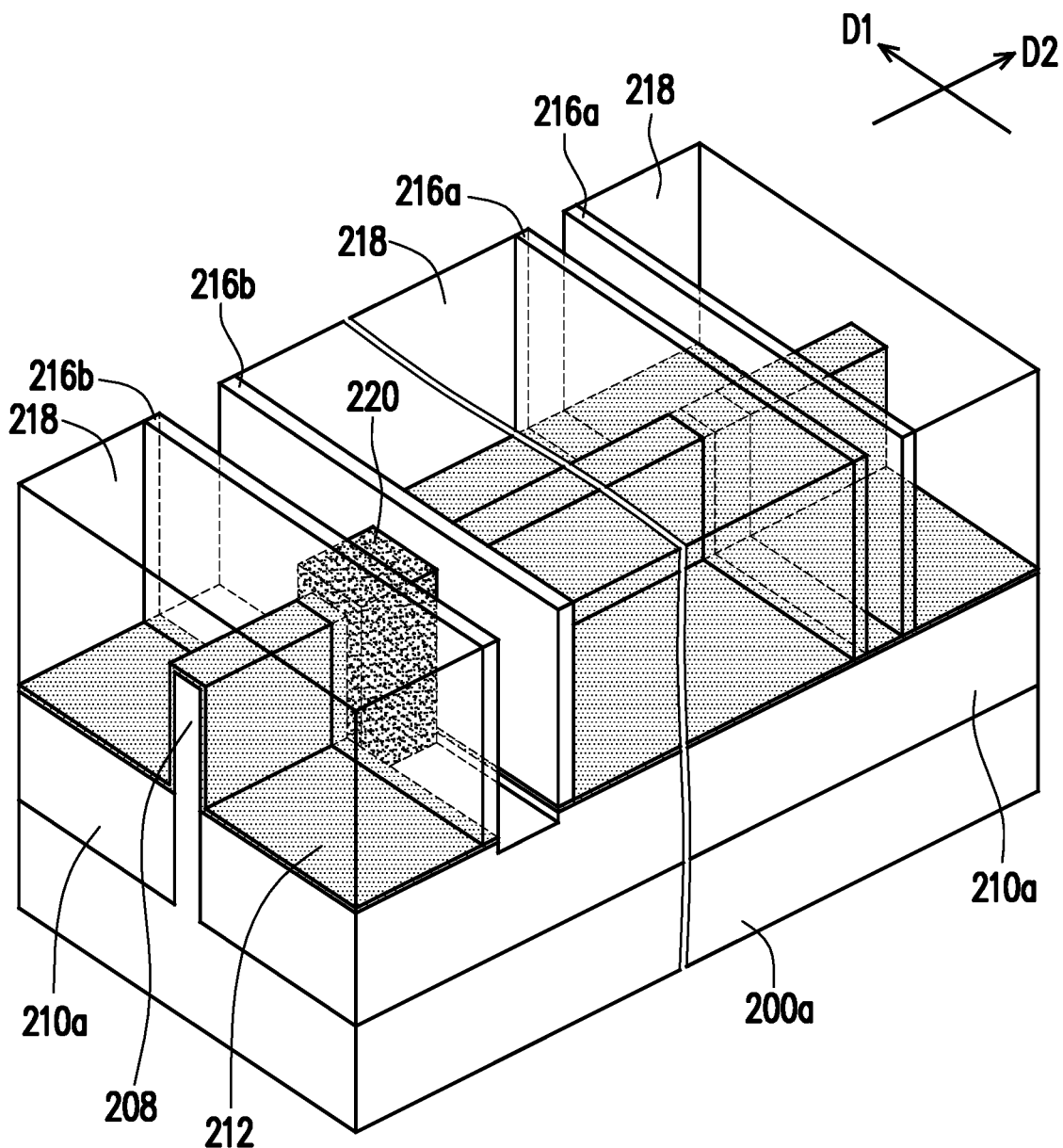

FIG. 2K is a perspective view of the semiconductor device at one of various stages of the manufacturing method. In Step S24 in FIG. 1 and as shown in FIGS. 2J-2K, after the second cavity C2 is formed, a second dielectric layer 220 is formed in the second cavity C2 so as to selectively cover the exposed portion of the semiconductor fin 208, wherein a thickness of the first dielectric layer 212 is smaller than a thickness of the second dielectric layer 220. The second dielectric layer 220 is selectively grown from the exposed portion of the semiconductor fin 208, and accordingly, the second dielectric layer 220 formed in the second cavity C2 does not cover the exposed portions of the insulators 210a and merely a portion of the sidewalls of the second spacers 216b is in contact with the second dielectric layer 220. In one embodiment, the second dielectric layer 220 may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In one embodiment, the second dielectric layer 220 is a high-k dielectric layer with a thickness in the range of about 5 nm to 50 nm. The second dielectric layer 220 may be formed by a suitable process such as thermal oxidation. The second dielectric layer 220 is thicker than the first dielectric layer 212 and is suitable for serving as a gate dielectric layer in long channel FinFETs.

Figure 2L:
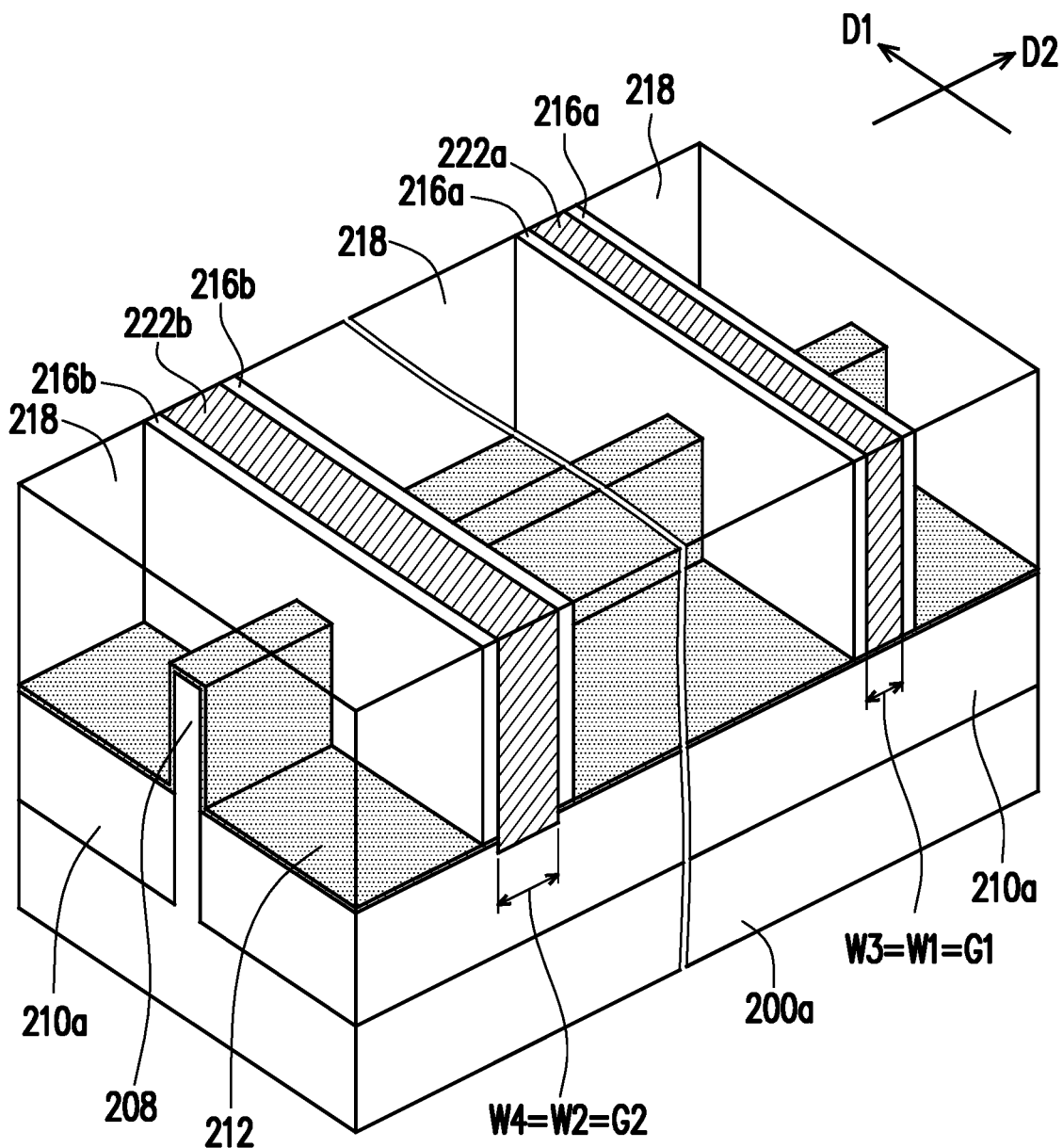

As shown in FIGS. 2K-2L, a first gate 222a is formed in the first cavity C1 and a second gate 222b is formed in the second cavity C2 to cover the second dielectric layer 220, the sidewalls of the second spacers 216b and the exposed portions of the insulators 210a. The second dielectric layer 220 is disposed between the second gate 222b and the exposed portion of the semiconductor fin 208. The second dielectric layer 220 does not exist between the second gate 222b and the pair of second spacers 216b. In some embodiments, the first gate 222a and the second gate 222b may comprise a single layer or multi-layered structure. In some embodiments, the first gate 222a and the second gate 222b may comprise metal, such as Al, Cu, W, Ti, Ta, TiN, TiAl, TiAlN, TaN, NiSi, CoSi, other conductive materials with a work function compatible with the substrate material, or combinations thereof. In some embodiments, a thickness of the first gate 222a and the second gate 222b is, for example, in the range of about 30 nm to about 60 nm. The first gate 222a and the second gate 222b may be formed by a suitable process such as ALD, CVD, PVD, plating, or combinations thereof.

In one embodiment, the width W3 of the first gate 222a ranges from 5 nm to 50 nm and the width W4 of the second gate 222b is greater than 50 nm. The portion of the semiconductor fin 208 that is overlapped with and covered by the first gate 222a serves as a channel of a short channel FinFET; and the portion of the semiconductor fin 208 that is overlapped with and covered by the second gate 222b serves as a channel of along channel FinFET.

As shown in FIG. 2G and FIG. 2L, the width W3 of the first gate 222a, the width W1 of the first dummy gate strip 214a and the first gap G1 between the pair of first spacer 216a are substantially equal (i.e. W3=W1=G1). The width W4 of the second gate 222b, the width W2 of the second dummy gate strip 214b and the second gap G2 between the pair of second spacer 216b are substantially equal (i.e. W4=W2=G2).

In the short channel FinFET (shown in the right portion of FIG. 2L), the thinner first dielectric layer 212 is formed to serve as a gate dielectric layer; in the long channel FinFET (shown in the left portion of FIG. 2L), the thinner first dielectric layer 212 is removed and replaced by the selectively grown and thicker second dielectric layer 220. Since the second dielectric layer 220 has greater thickness, the exposed portion of the semiconductor fin 208 is well encapsulated such that leakage path and extrusion path for the second gate 222b can be prevented. Accordingly, process window of gate replacement process is enlarged. Therefore, yield and reliability of the semiconductor device are enhanced.

In accordance with some embodiments of the present disclosure, a method for fabricating a FinFET includes at least the following steps. A substrate is patterned to form trenches in the substrate and a semiconductor fin between the trenches. A plurality of insulators are formed in the trenches and a first dielectric layer is formed to cover the semiconductor fin and the insulators. A dummy gate strip is formed on the first dielectric layer, wherein a lengthwise direction of the dummy gate strip is different from a lengthwise direction of the semiconductor fin. A pair of spacers are formed on sidewalls of the dummy gate strip. The dummy gate strip and the first dielectric layer underneath are removed until sidewalls of the spacers, a portion of the semiconductor fin and portions of the insulators are exposed. A second dielectric layer is selectively formed to cover the exposed portion of the semiconductor fin, wherein a thickness of the first dielectric layer is smaller than a thickness of the second dielectric layer. A gate is formed between the spacers to cover the second dielectric layer, the exposed sidewalls of the spacers and the exposed portions of the insulators.

In accordance with alternative embodiments of the present disclosure, a method for fabricating a semiconductor device includes at least the following steps. A substrate is patterned to form trenches in the substrate and semiconductor fins between the trenches. A plurality of insulators are formed in the trenches. A first dielectric layer is formed to cover the semiconductor fins and the insulators. At least one first dummy gate strip and at least one second dummy gate strip are formed on the first dielectric layer, wherein lengthwise directions of the first and second dummy gate strips are different from a lengthwise direction of the semiconductor fins, and a width of the first dummy gate strip is smaller than a width of the second dummy gate strip. A pair of first spacers and a pair of second spacers are formed on sidewalls of the first and second dummy gate strips respectively. The first dummy gate strip is removed to form a first cavity. The second dummy gate strip and the first dielectric layer underneath are removed until sidewalls of the second spacers, a portion of the semiconductor fins and portions of the insulators are exposed to form a second cavity. A second dielectric layer is formed in the second cavity to selectively cover the exposed portion of the semiconductor fins, wherein a thickness of the first dielectric layer is smaller than a thickness of the second dielectric layer. A first gate is formed in the first cavity. A second gate is formed in the second cavity to cover the second dielectric layer, the exposed sidewalls of the spacers and the exposed portions of the insulators.

In accordance with yet alternative embodiments of the present disclosure, a semiconductor device including a substrate, a plurality of insulators, a first dielectric layer, a pair of first spacers, a first gate, a pair of second spacers, a second dielectric layer and a second gate is provided. The substrate includes trenches and semiconductor fins between trenches. The insulators are disposed in the trenches. The first dielectric layer covers the semiconductor fins and the insulators, and the first dielectric layer exposes a portion of the semiconductor fins and portions of the insulators. The first spacers are disposed on the first dielectric layer. The first gate is disposed on the first dielectric layer and between the first spacers. The second spacers are disposed on the first dielectric layer. The second dielectric layer is disposed between the second spacers, wherein the second dielectric layer selectively covers the exposed portion of the semiconductor fins, and a thickness of the first dielectric layer is smaller than a thickness of the second dielectric layer. The second gate is disposed between the second spacers to cover the second dielectric layer, the exposed sidewalls of the spacers and the exposed portions of the insulators, wherein a width of the first gate is smaller than a width of the second gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a substrate having a semiconductor fin;
a plurality of insulators disposed on the substrate, wherein the semiconductor fin is located between the plurality of insulators;
a first dielectric layer covering a portion of the semiconductor fin and the insulators;
a second dielectric layer covering another portion of the semiconductor fin, wherein a thickness of the first dielectric layer is smaller than a thickness of the second dielectric layer;
interlayer dielectric layers disposed on the first dielectric layer and in contact with the first dielectric layer;

a first gate disposed on the first dielectric layer and across the semiconductor fin, and in contact with the first dielectric layer;

a second gate disposed on the second dielectric layer and across the semiconductor fin, wherein a width and a height of the first gate are smaller than a width and a height of the second gate.

2. The semiconductor device of claim 1, further comprising a pair of first spacers and a pair of second spacers disposed on and in contact with the first dielectric layer, wherein the pair of first spacers are located on two sides of the first gate, the pair of second spacers are located on two sides of the second gate.

3. The semiconductor device of claim 2, wherein the width of the second gate substantially equals to a distance between the pair of second spacers.

4. The semiconductor device of claim 2, wherein the second dielectric layer is covering another portion of the semiconductor fin and located in between the pair of second spacers.

5. The semiconductor device of claim 1, wherein the thickness of the first dielectric layer ranges from 0.2 nm to 5 nm and the thickness of the second dielectric layer ranges from 5 nm to 50 nm.

6. The semiconductor device of claim 1, wherein the width of the first gate ranges from 5 nm to 50 nm and the width of the second gate is greater than the first gate.

7. The semiconductor device of claim 1, wherein the second dielectric layer is in contact with the semiconductor fin and the second gate.

8. A semiconductor device, comprising:
a substrate having a plurality of semiconductor fins;
a plurality of insulators disposed on the substrate in between the plurality of semiconductor fins;
a first dielectric layer covering the semiconductor fins and the insulators, the first dielectric layer exposing a portion of the semiconductor fins and portions of the insulators;
a pair of first spacers disposed on the first dielectric layer;
a first gate disposed on the first dielectric layer and between the first spacers, the first gate is in contact with the first dielectric layer;
a pair of second spacers disposed on the first dielectric layer;
a second dielectric layer disposed between the second spacers, wherein the second dielectric layer covers the exposed portion of the semiconductor fins, and a thickness of the first dielectric layer is smaller than a thickness of the second dielectric layer; and
a second gate disposed between the second spacers to cover the second dielectric layer, the exposed sidewalls of the spacers and the exposed portions of the insulators, wherein a width of the first gate is smaller than a width of the second gate.

9. The semiconductor device of claim 8, wherein the thickness of the first dielectric layer ranges from 0.2 nm to 5 nm and the thickness of the second dielectric layer ranges from 5 nm to 50 nm.

10. The semiconductor device of claim 8, wherein the width of the first gate ranges from 5 nm to 50 nm and the width of the second gate is greater than the first gate.

11. The semiconductor device of claim 8, wherein the width of the second gate substantially equals to a distance between the pair of second spacers.

12. The semiconductor device of claim 8, wherein the second dielectric layer is disposed between the exposed portion of the semiconductor fin and the second gate.

13. The semiconductor device of claim 8, further comprising interlayer dielectric layers disposed on the first dielectric layer and adjacent to the pair of first spacers and the pair of second spacers.

14. A semiconductor device, comprising:
a substrate having a plurality of semiconductor fins;
a plurality of insulators disposed on the substrate in between the plurality of semiconductor fins;
a first dielectric layer covering the semiconductor fins and the insulators, the first dielectric layer exposing a portion of the semiconductor fins and portions of the insulators;
a pair of first spacers disposed on the first dielectric layer, and in contact with the first dielectric layer;
a pair of second spacers disposed on the first dielectric layer, and in contact with the first dielectric layer, wherein a distance between the pair of second spacers is larger than a distance between the pair of first spacers;
a second dielectric layer disposed in between the second spacers, wherein the second dielectric layer covers the exposed portion of the semiconductor fins and uncovers the exposed portions of the insulators, and a thickness of the first dielectric layer is smaller than a thickness of the second dielectric layer;
a first gate disposed on the first dielectric layer across the semiconductor fins and between the first spacers;
a second gate disposed on the second dielectric layer across the semiconductor fins and between the gap of the second spacers, wherein the second gate covers the exposed sidewalls of the second spacers and the exposed portions of the insulators.

15. The semiconductor device of claim 14, wherein the thickness of the first dielectric layer ranges from 0.2 nm to 5 nm and the thickness of the second dielectric layer ranges from 5 nm to 50 nm.

16. The semiconductor device of claim 14, wherein a width and a height of the first gate are smaller than a width and a height of the second gate.

17. The semiconductor device of claim 14, further comprising interlayer dielectric layers disposed on and in contact with the first dielectric layer and adjacent to the pair of first spacers and the pair of second spacers.

18. The semiconductor device of claim 1, wherein the second gate is disposed on the second dielectric layer and in contact with the plurality of insulators, the first dielectric layer and the second dielectric layer.

19. The semiconductor device of claim 14, wherein a width of the first gate ranges from 5 nm to 50 nm and a width of the second gate is greater than the first gate.

20. The semiconductor device of claim 14, wherein the second gate is disposed on the second dielectric layer and in contact with the plurality of insulators, the first dielectric layer and the second dielectric layer.

* * * * *